United States Patent [19]

Hsu

[11] 4,118,289
[45] Oct. 3, 1978

[54] TIN/LEAD PLATING BATH AND METHOD

[75] Inventor: Grace F. Hsu, Somers, Conn.

[73] Assignee: Minnesota Mining and Manufacturing Company, Saint Paul, Minn.

[21] Appl. No.: 866,537

[22] Filed: Jan. 3, 1978

Related U.S. Application Data

[63] Continuation of Ser. No. 374,643, Jun. 28, 1973, abandoned, which is a continuation-in-part of Ser. No. 83,229, Oct. 22, 1970, Pat. No. 3,785,939.

[51] Int. Cl.$^2$ .......................... C25D 3/56; C25D 3/60
[52] U.S. Cl. ................................................... 204/43 S
[58] Field of Search ...................... 204/43 S, 53, 54 R

[56] References Cited

U.S. PATENT DOCUMENTS

| 3,661,730 | 5/1972 | Nishihara | 204/43 S |
| 3,730,853 | 5/1973 | Sedlacek et al. | 204/43 S |
| 3,769,182 | 10/1973 | Hsu | 204/43 S |
| 3,785,939 | 1/1974 | Hsu | 204/43 S |

OTHER PUBLICATIONS

Frederick A. Lowenheim, "Modern Electroplating", pp. 462–463, (1968).

*Primary Examiner*—G. L. Kaplan
*Attorney, Agent, or Firm*—Cruzan Alexander; Donald M. Sell; Gerald F. Chernivec

[57] ABSTRACT

A plating bath for electrodeposition of tin/lead alloys contains stannous ion, lead ion, a fluoborate, fluosilicate or sulfamate radical and, as a brightener system, a nonionic polyoxyalkylated surfactant, a lower aliphatic aldehyde, an amine and a cyclic brightener selected from the group consisting of heterocyclic carboxaldehydes, aromatic ketones and carboxylic acids, the pH of the bath being less than about 3.0.

18 Claims, No Drawings

TIN/LEAD PLATING BATH AND METHOD

CROSS-REFERENCE TO RELATED APPLICATION

This is a continuation of application Ser. No. 374,643 filed June 28, 1973, now abandoned, which in turn was a continuation-in-part of application Ser. No. 83,229, filed Oct. 22, 1970 and now U.S. Pat. No. 3,785,939.

BACKGROUND OF THE INVENTION

Electrodeposited tin/lead alloys of different compositions are valuable in a number of applications including the provision of bearing contact surfaces (for which a 7/93 tin/lead alloy is typically used) and the provision of surfaces for soldering such as on printed circuit boards and the like (for which alloys of 60/40 tin/lead are desired). Although a number of formulations have been suggested for use in producing solder plate, it is believed that a significant need remains for a bath that is capable of producing a high quality tin/lead deposit having a composition at or near the eutectic value for the alloys (about 63/37), as is optimum for soldering purposes. Moreover, effective compositions for producing bright or semi-bright alloy electrodeposits have not been available commercially, and there is a widespread demand for a practical way of producing such deposits on articles of various types for both technical and also aesthetic reasons. It is also desirable that such deposits retain their solderability over extended periods of time, and either be resistant to discoloration or be adapted to facile treatment to prevent such discoloration.

Accordingly, it is an object of the present invention to provide a novel electroplating bath that is capable of producing relatively bright deposits of tin/lead alloy.

It is also an object of the invention to provide such a bath that is capable of producing the metal deposits with good current efficiency, that is operable over a broad range of current densities and that exhibits good covering power.

Another object is to provide workpieces having an optimum tin/lead alloy electrodeposit for soldering, where the composition is at or near the eutectic point for tin/lead alloys and is at least relatively bright.

Still another object is to provide an electroplating method for the production of high quality tin/lead alloy deposits, which method is efficient and effective, is conducted under convenient conditions, and is capable of producing bright solderplate deposits.

SUMMARY OF THE DISCLOSURE

It has now been found that the foregoing and related objects can be readily attained in an aqueous acid plating bath for the electrodeposition of tin/lead alloys comprising about 5.0 to 80.0, and preferably about 45.0 to 65.0 grams per liter of stannous ion; about 85.0 to 10.0, and preferably about 35.0 to 15.0 grams per liter of lead ion; and at least about 100.0, and preferably at least about 150.0, grams per liter of radical selected from the group consisting of fluoborate, fluosilicate, and sulfamate. The bath also includes, as a brightener system, at least about 5.0 grams per liter of a nonionic polyoxyalkylated surfactant, at least about 4.0 grams per liter of a lower aliphatic aldehyde containing 1 to 4 carbon atoms, at least about 2.0 grams per liter of an amine, and at least about 0.25 gram per liter of a brightener selected from the group consisting of heterocyclic carboxaldehydes, aromatic ketones and aromatic carboxylic acids and mixtures thereof; the bath has a pH of less than about 3.0. Preferably, the amount of the components of the brightener system are 10.0 to 30.0, 5.0 to 15.0, 3.0 to 12.0, and 0.4 to 5.0 grams per liter, respectively, and the pH of the bath is most desirably below about 1.0.

In the preferred embodiments, the brightener system of the bath includes at least about 0.3 grams per liter of a polyhalogenated benzene compound, such as trichlorinated benzene. When the bath utilizes the fluoborate radical, as is preferred, it desirably also contains at least about 50.0 grams per liter of free fluoboric acid and at least about 10.0 grams per liter of free boric acid. The amine employed is desirably an aromatic amine selected from the group consisting of toluidines and aniline, and is preferably either ortho- or meta- toluidine included in an amount of about 3.0 to 12.0 grams per liter. The lower aliphatic aldehyde that is used is preferably formaldehyde, and it is preferably present in an amount of about 5.0 to 15.0 grams per liter. If desired, the bath may additionally include about 0.5 to 7.5 grams per liter of an additive selected from the class consisting of peptone, resorcinol, glue, gelatine, beta-napthol, polyvinyl alcohol, cresylic acid, and mixtures thereof. Advantageously, it includes about 0.5 to 2.0 grams per liter of cresylic acid.

Certain objects of the invention are also readily attained in a method of electroplating tin/lead alloys wherein a bath having a composition as hereinbefore described is first prepared. The bath is maintained at a temperature of at least about 50° Fahrenheit, and a workpiece having a metallic surface and at least one anode to provide the necessary tin and lead anodic supply are immersed therein. Thereafter, a voltage is applied across the anode and the two workpiece to deposit tin and lead on the metallic surface, and the voltage applied provides a current density at the workpiece of about 10 to 200 amperes per square foot.

Preferably, there is utilized an alloy anode having a composition of approximately 60.0 percent by weight of tin and 40.0 percent by weight of lead. Alternatively, at least two anodes may be immersed in the bath, one of which consists essentially of tin and the other of which consists essentially of lead, with the method including the step of apportioning the current between the anodes so as to deposit tin and lead upon the workpiece in the desired proportions.

DETAILED DESCRIPTION OF THE PREFERRED EMBODIMENTS

The bath electrolyte is preferably provided by the fluoborate, fluosilicate, or sulfamate salts of tin and lead, although other salts may be used to furnish all or a portion of the tin and lead ions, and the desired radical may be provided by a suitable acid, such as fluoboric. It should be appreciated that the foregoing terms are used generically herein, and may encompass the more complex salts such as the phenolsulfamate compounds. In any event, the amount of stannous ion provided must be in the range of about 5.0 to 80.0 grams per liter and the amount of lead ion employed therewith must range from about 85.0 to 10.0 grams per liter. Preferably, the amount of stannous ion will exceed the lead ion and will be in the range of about 45.0 to 65.0 grams per liter, with the amount of lead ranging from about 35.0 to 15.0 grams per liter. A most desirable feature of the invention is that it enables the formation of electrodeposits of solder having a composition at or near the eutectic point for tin/lead alloys, and the most desirable range of the ions in the bath therefor is about 53.0 to 57.0 grams of stannous ion per liter and about 27.0 to 23.0 grams of lead ion per liter.

The fluoborate baths are preferred and, to be satisfactory, must contain at least about 100.0 grams per liter of the fluoborate radical; preferably the amount of the radical will not be less than about 150.0 grams per liter. Such a bath should contain at least about 50.0 grams per liter of fluoboric acid and at least about 10.0 grams per liter of boric acid.

A typical "make-up" formula (brightening system and additives omitted) for a liter bath, that has performed well, is as follows (percentages expressed being by weight):

| | | |
|---|---|---|
| Stannous Fluoborate Concentrate | 272 | grams |
| 49.8% Stannous Fluoborate | | |
| 1.8% Fluoboric Acid | | |
| 2.0% Boric Acid | | |
| Lead Fluoborate Concentrate | 92.8 | grams |
| 51% Lead Fluoborate | | |
| 0.6% Fluoboric Acid | | |
| 1.9% Boric Acid | | |
| Fluoboric Acid (49%) | 142 | milliliters |
| Boric Acid | 18.3 | grams |

The foregoing formulation provides about 60.0 grams per liter of total tin (about 55.0 grams per liter of stannous ion and about 5.0 grams per liter of stannic ion) about 25.0 grams per liter of lead ion, about 100.0 grams per liter of fluoboric acid (absolute), and about 25.0 grams per liter of boric acid.

In accordance with the concept of the present invention, the foregoing type of make-up formulation (be it of the fluoboric, fluosilicate, or sulfamate variety) must also contain a brightener system comprised of at least about 5.0 grams per liter of a nonionic polyoxyalkylated surfactant, at least about 4.0 grams per liter of a lower aliphatic aldehyde, at least about 2.0 grams per liter of an amine, and at least about 0.25 gram per liter of a brightener of the heterocyclic carboxaldehyde, aromatic ketone or aromatic carboxylic acid type. Desirably the brightener system also includes at least 0.3 grams per liter of a polyhalogenated benzene compound. Preferably, the amounts of the foregoing components will be about 10.0 to 30.0, 5.0 to 15.0, 3.0 to 12.0 and 0.4 to 5.0, grams per liter, respectively of the surfactant, lower aliphatic aldehyde, amine and brightener.

As regards the specific composition of the nonionic surfactant, virtually any surface active polyoxyalkylated compound that is soluble in the bath may be employed, and a wide variety of such materials are commercially available under a number of different trademarks. However, the polyethoxylated fatty acid monoalkanolamides and related amines, and the polyethoxylated alkylphenols have performed particularly effectively. Exemplary of the polyethoxylated fatty acid monoethanolamides that may be used to advantage are the cocoanut fatty acid and lauric acid derivatives sold by Stepan Chemical Company of Northfield, Illinois under the trademarks AMIDOX C-5 and AMIDOX L-5, respectively. Exemplary of the polyethoxylated alkylphenol surfactants that may advantageously by used is the ethoxylated nonylphenol derivative sold by Onyx Chemical Company of Jersey City, N.J., under the trademark NEUTRONYX 675. Substitution of similar materials is contemplated and encompassed within the scope of the invention, and specific alternative surfactants will be apparent to those skilled in the art, in view of the foregoing disclosure. Further details concerning the nature of the preferred polyethoxylated compounds can be found in applicant's co-pending application Ser. No. 160,109, filed May 25, 1973, entitled "Bath and Method for Electrodepositing Tin and/or Lead" and now U.S. Pat. No. 3,769,182.

With regard to the specific lower aliphatic aldehyde constituent, it should contain 1 to 4 carbon atoms and, although acetaldehyde, butyraldehyde and propionaldehyde may be employed, formaldehyde is preferred.

In applicant's co-pending application Ser. No. 83,229, the use of aromatic aldehydes has been disclosed and claimed to provide the organic brightener in conjunction with the various other components. Applicant has also found that certain other carbonyl compounds will function satisfactorily as brighteners in the claimed combination of the aforementioned application, particularly when employed in conjunction with a polyhalogenated benzene compound. More particularly, the brighteners that may be utilized in accordance with the present application comprise heterocyclic carboxaldehydes, aryl ketones and aryl carboxylic acids. The heterocyclic carboxaldehydes are those in which the heterocyclic ring has five members and the carboxaldehyde group is attached to a carbon atom on the ring. Thus, these compounds are based upon thiophene, furan and pyrrole. The carboxaldehyde group is attached to one of the carbons in the ring which generally will be in the 2-position, and the preferred compounds are those in which a simple carboxaldehyde group (—CHO) is employed although longer carbon chain carboxaldehydes may also be employed; in addition, the carboxaldehydes may be ring- or chain-substituted materials. Specific heterocyclic carboxaldehydes which have proved highly effective are furfural (2-furaldehyde), 2-thiophene carboxaldehyde and 2-pyrrole carboxaldehyde.

Among the various aromatic ketones which may be employed are benzylideneacetone, benzil, 4-p-sulfophenyl-3-butene-2-one, 1,5-di-sulfophenyl-1,4-pentadiene-3-one and 4-hydroxy-3-methoxybenzylideneacetone.

Among the aromatic carboxylic acids which may be employed are chlorobenzoic acid, salicylic acid, cinnamic acid and o-methoxycinnamic acid.

As indicated previously, another essential component of the brightener system is an amine compound which may be selected from the group consisting of aliphatic amines, aromatic amines, and mixtures thereof. Although aliphatic compounds such as butylamine and the like have been effective, particularly outstanding improvements have been noted to result from the inclusion of aromatic amines, and especially from the use of ortho-toluidine, meta-toluidine and aniline. The amine should be used in an amount of no less than about 2.0 grams per liter; preferably the amount will be between 3.0 and 12.0 grams per liter, and most desirably about 4.0 grams per liter thereof will be used.

The effectiveness of the brighteners have been found to be improved by the incorporation of ring polyhalogenated benzene derivatives and particularly trichlorinated benzene derivatives. The preferred benzene derivatives are those which are polychlorinated although other halogens may be employed but with less advantageous results. Although disubstituted compounds provide some benefits, the preferred compounds are those which are trihalogenated. Although the substitution can be on various carbon atoms of the benzene ring, the preferred compound has been found to be 1,2,4-trichlorobenzene. The amount utilized may vary fairly widely, as little as about 0.3 gram per liter produces advantageous results and amounts above 10.0 grams per liter produce no great benefit and appear to interfere with the operation of the bath. The preferred range is 0.5 to 3.0 grams per liter which tends to increase brightness at the lower end of the current density range and to smooth the composition and to reduce or eliminate the so-called "orange peel" effect which may otherwise occur.

Among other additives which may be included to modify the operation of the present bath are auxiliary surfactants, secondary brighteners, and other materials, such as the polyvinyl alcohols, peptone, resorcinol, glue, gelatine, beta-naphthol, etc., which should usually be added in amounts of about 0.5 to 7.5 grams per liter. It has been found that use of about 0.5 to 5.0 grams per liter of cresylic acid is a particularly desirable expedient since it improves the smoothness of the deposits obtained to a considerable degree. Although little or no tendency for metal sludge or precipitate formation has been noted in baths properly operated in accordance with the invention, in some instances it may be desirable to incorporate a chelating agent such as citric acid, malic acid, or the aminopolyacetic acids (e.g., ethylenediamine tetraacetic acid, ethylenetriamine pentaacetic acid, nitrilotriacetic acid). Such chelating agents, when employed, are generally included in an amount of about 5.0 to 20.0 grams per liter.

Since some of the suitable brighteners and other components which may desirably be included in the bath exhibit relatively low solubility therein, it may be necessary or desirable to employ a solvent solution thereof to facilitate formulation of the bath. Among the various solvents that may be employed, depending upon the particular component involved, are the low molecular weight alcohols (methanol, ethanol, and propanol) and the low molecular weight glycol ethers (ethylene glycol monoethyl ether, etc.). Generally, the component will be added as a 0.1 to 5.0 and preferably as a 0.5 to 2.0 percent by weight solution so as to obtain a stable solvent solution which may be readily dispersed in the acid bath. A typical brightener system found to produce bright solder plate deposits, in combination with the typical "make-up" formulation hereinbefore described, has the following composition, on a liter basis:

| | | |
|---|---|---|
| Polyethoxylated fatty acid monoethanolamine surfactant (AMIDOX C-5) | 15 | milliliters |
| Ortho-toluidine | 5 | milliliters |
| Formaldehyde (37 weight % in water) | 30 | milliliters |
| Benzylideneacetone (10 weight % in methanol) | 3 | milliliters |
| 1,2,4-trichlorobenzene | 2.1 | grams |

As has been indicated previously, the baths of the present invention are operable over a fairly wide range of cathode current density, depending upon other factors such as temperature, agitation, etc. More specifically, the operable range is about 10.0 to 200.0 amperes per square foot (ASF) and preferably about 20.0 to 120.0 ASF, with a narrower range of 25.0 to 35.0 ASF being most desirable for the production of deposits having a substantially eutectic composition. The plating efficiency is generally quite high and will range up to about 95 percent under optimum conditions, based upon the theoretical rate of deposition, and bright deposits of excellent quality can best be produced at a bath efficiency in excess of 70 percent. The applied voltage should be about 0.2 to 5.0 volts and preferably 0.5 to 4.0 volts.

The baths should be operated at a temperature of at least about 50° Fahrenheit, and preferably from about 60 to 90° Fahrenheit. Operation below about 50° Fahrenheit tends to be inefficient and to produce undesirable deposits, whereas temperatures higher than about 90° Fahrenheit tend to cause oxidation of the tin ion to the stannic state and to produce dull, rough and generally unacceptable deposits; furthermore, the bath is consumed at an excessive rate at temperatures that are unduly high.

Any metallic substrate or metal-surfaced article which can be plated with tin using prior art baths may be coated in accordance with the present invention. For example, good deposits may be produced upon articles of copper, nickel, iron, steel, etc. The best results are obtainable with these baths if relatively pure anodes of the metals are employed, and either tin/lead alloy anodes or separate tin anodes and lead anodes may be used. It should be noted that the composition of the anode has a significant effect upon the composition of the deposit, and that it is generally desirable to employ an anode having a proportion of metals approximating that desired in the plated alloy. The composition of the deposit may also be controlled by use of separate anodes of tin and lead, to which the current may be proportioned appropriately.

Some agitation is desirable to obtain high quality, uniform deposits and to avoid development of sludge or film, and plating at high current densities and temperatures may be improved by more intense agitation. However, excessively high rates of agitation are undesirable because they can cause excessive consumption of the bath and impose limitations upon the current densities at which brightness is achieved. Not only is agitation of the bath itself desirable but agitation of the cathode may be beneficial in obtaining a uniform plate and enabling extension of the range of satisfactory current density.

The process is adapted to still plating and barrel plating apparatus with equal efficacy, and may be used for strip, wire and connector strip. Use of the bath and process is particularly significant with respect to connector strip, printed circuit boards, and the like because of the excellent solderability of the plate produced. Filtration of the bath is not essential but will normally be beneficial when contamination of the bath is encountered due to air-borne impurities and carryover from other finishing operations; preferably, it will be effected on a continuous basis. Various filtering media may be utilized including fabrics, such as a polypropylene, and other conventional filtering materials.

The depletion of the various components of the bath is best corrected by analysis for the several components on a periodic basis which can be established for a given facility. To determine the amounts of stannous salt required, an iodine titration technique may be used; the lead content may be checkbed by precipitation with dilute sulfuric acid. The amount of the surfactant and other components may be best evaluated by testing a sample of the bath in a suitable test cell, and a suitable schedule may be established for a given facility and workpiece.

Illustrative of the efficacy of the present invention are the following specific examples, wherein all percentages are on a weight basis.

EXAMPLE ONE

An aqueous plating bath is prepared by admixing, with water, sufficient quantities of stannous and lead fluoborate concentrate, fluoboric acid, and boric acid, to provide 55.0 grams per liter of stannous tin (as metal), 25.0 grams per liter of lead (as metal), 140.0 grams per liter of fluoboric acid, and 34.0 grams per liter of boric acid. The bath also contains a brightener system consisting of about 15.0 grams per liter of an ethoxylated coconut fatty acid monoethanolamide containing 5 moles of ethylene oxide per mole of amide (sold by Stepan Chemical Company of Northfield, Ill. under the trademark AMIDOX C-5), about 5.0 milliliters per liter of ortho-toluidine, about 30.0 milliliters per liter of 37.0 percent formaldehyde, and about 6.0 milliliters per liter of a 10.0 percent methanol solution of benzylideneacetone (0.3 gram per liter). The pH of the bath is less than 1.0.

Plating is effected in a Hull cell at room temperature, using as the anode an alloy of 60/40 tin/lead. The bright plating current density range was found to extend from about 30 to more than 120 amperes per square foot. Even in the range of 20–30 A.S.F. the deposits are of good quality, albeit with a milky appearance.

The quantity of benzylideneacetone is increased to 0.9 gram per liter and the Hull cell test repeated. The bright plating range is extended down to 20 A.S.F.

The addition of 2.1 grams per liter of 1,2,4-trichlorobenzene to the basic formulation is found to improve the quality of the deposit by reducing striations (orange peel).

EXAMPLE TWO

The test formulation of Example One is prepared substituting 0.75 gram per liter of benzil

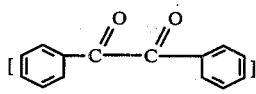

for the benzylideneacetone. The bright plating range extends from 60 to over 120 A.S.F. with a good but milky and striated deposit in the range of 60–30 A.S.F. Addition of 2.1 grams per liter of 1,2,4-trichlorobenzene extends the bright plating range to 40 A.S.F. and the milky deposit to 15 A.S.F. with significant reduction in striations.

EXAMPLE THREE

The test formulation of Example One is prepared substituting 0.3 grams per liter of α-thiophene aldehyde as the brightener. A bright deposit is obtained in the range of 75 to over 120 A.S.F. with a good but milky deposit in the range down to 40 A.S.F. Doubling the amount of brightener extends the good but milky deposit down to 20 A.S.F. Addition of 2.1 grams per liter of 1,2,4-trichlorobenzene improves the orange peel effect.

EXAMPLE FOUR

The test formulation of Example One is prepared substituting 4.0 grams per liter of chlorobenzoic acid. A bright deposit is obtained in the range of about 90 to over 120 A.S.F. and a milky but good deposit down to 40 A.S.F. Addition of 2.1 grams per liter of 1,2,4-trichlorobenzoic acid provides a bright plating range of 50 to over 120 A.S.F. and a milky but good deposit to 30 A.S.F.

Thus, it can be seen that the present invention provides a novel electroplating bath that is capable of producing relatively bright deposits of tin/lead alloy. The bath produces such deposits with good current efficiency and good covering power, and it is operable over a broad range of current densities. The invention provides workpieces having at least realtively bright tin/lead alloy electrodeposits in which the composition is at or near the eutectic point for such alloys, as is optimum for soldering, and the method provided is effecient and effective, may be conducted under convenient conditions, and is capable of producing high quality deposits, as previously described.

Having thus described the invention, I claim:

1. An aqueous acid plating bath for electrodeposition of tin/lead alloys comprising about 5.0 to 80.0 grams per liter of stannous ion; about 85.0 to 10.0 grams per liter of lead ion; at least about 100.0 grams per liter of a radical selected from the group consisting of fluoborate, fluosilicate and sulfamate; and, as a brightener system, at least about 5.0 grams per liter of a nonionic polyoxyalkylated surfactant, at least about 4.0 grams per liter of a lower aliphatic aldehyde containing 1 to 4 carbon atoms, at least about 2.0 grams per liter of an amine, at least about 0.3 grams per liter of a polyhalogenated benzene compound and at least about 0.25 gram per liter of a brightener selected from the group consisting of heterocyclic carboxaldehydes, aromatic ketones and aromatic carboxylic acids and mixtures thereof, said bath having a pH of less than about 3.0.

2. The bath of claim 1 wherein said radical is fluoborate and said bath contains at least about 150.0 grams per liter thereof, wherein said bath contains at least about 50.0 grams per liter of free fluoboric acid and at least about 10.0 grams per liter of free boric acid, and wherein said pH is less than about 1.0.

3. The bath of claim 1 wherein said amine is an aromatic amine selected from the group consisting of toluidines and aniline, and wherein said lower aliphatic aldehyde is formaldehyde.

4. The bath of claim 1 wherein said polyhalogenated benzene compound is trichlorobenzene and is present in an amount of 0.5 to 3.0 grams per liter.

5. The bath of claim 1 containing about 45.0 to 65.0 grams per liter of stannous ion and about 35.0 to 15.0 grams per liter of lead ion.

6. The bath of claim 5 wherein said radical is fluoborate and said bath contains at least about 150.0 grams per liter thereof, wherein said bath contains at least about 50.0 grams per liter of free fluoboric acid and at least about 10.0 grams per liter of free boric acid, wherein said lower aliphatic aldehyde is provided by about 5.0 to 15.0 grams per liter of formaldehyde, and wherein said pH is less than about 1.0.

7. The bath of claim 6 wherein said amine component comprises about 3.0 to 12.0 grams per liter of an aromatic amine selected from the group consisting of ortho- and meta-toluidines, wherein said surfactant is selected from the class consisting of ethoxylated fatty acid monoalkanolamines and ethoxylated alkylphenols and is present in an amount of about 10.0 to 30.0 grams per liter, and wherein said brightener is present in an amount of about 0.4 to 5.0 grams per liter.

8. The bath of claim 7 wherein said trichlorinated benzene compound is 1,2,4-trichlorobenzene.

9. In a method of electroplating tin/lead alloys, the steps comprising:
 a. preparing an aqueous acid plating bath comprising about 5.0–80.0 grams per liter of stannous ion, about 85.0–10.0 grams per liter of lead ion, at least about 100.0 grams per liter of a radical selected from the groups consisting of fluoborate, fluosilicate and sulfamate and, as a brightener system at least about 5.0 grams per liter of a nonionic polyoxyalkylated surfactant, at least about 4.0 grams per liter of a lower aliphatic aldehyde containing 1 to 4 carbon atoms, and at least about 2.0 grams per liter of at least one aliphatic amine and at least about 0.25 gram per liter of a brightener selected from the group consisting of heterocyclic carboxaldehydes, aromatic ketones and mixtures thereof, said bath having a pH of less than about 3.0;

b. maintaining said bath at a temperature of at least about 50° Fahrenheit;

c. immersing a workpiece having a metallic surface and at least one anode providing tin and lead in said bath; and d. applying a voltage across said anode and workpiece to deposit tin and lead on said metallic surface, said voltage providing a current density of about 10 to 200 amperes per square foot at the workpiece.

10. The method of claim 9 wherein said anode contains approximately 60.0 percent by weight of tin and 40.0 percent by weight of lead.

11. The method of claim 10 wherein said voltage provides a current density of about 25 to 35 amperes per square foot at the workpiece to produce a tin/lead alloy thereon having a composition of about 62.0 to 64.0 percent by weight of tin and, conversely, about 38.0 to 36.0 percent by weight of lead.

12. The method of claim 9 wherein at least two anodes are immersed in said bath, one of said anodes consisting essentially of tin and the other of said anodes consisting essentially of lead, and wherein said method includes the step of apportioning the current between said anodes so as to deposit tin and lead in desired proportions upon the workpiece.

13. The method of claim 9 wherein said applied voltage provides a current density of about 20 to 120 amperes per square foot at the workpiece.

14. An aqueous acid plating bath for electrodeposition of tin/lead alloys comprising about 5.0 to 80.0 grams per liter of stannous ion; about 85.0 to 10.0 grams per liter of lead ion; at least about 100.0 grams per liter of a radical selected from the group consisting of fluoborate, fluosilicate and sulfamate; and, as a brightener system, at least about 5.0 grams per liter of a nonionic polyoxyalkylated surfactant, at least about 4.0 grams per liter of a lower aliphatic aldehyde containing 1 to 4 carbon atoms, at least about 2.0 grams per liter of at least one aliphatic amine and at least about 0.25 gram per liter of a brightener selected from the group consisting of heterocyclic carboxaldehydes, aromatic ketones and mixtures thereof, said bath having a pH of less than about 3.0.

15. The bath of claim 14 wherein said radical is fluoborate and said bath contains at least about 150.0 grams per liter thereof, wherein said bath contains at least about 50.0 grams per liter of free fluoboric acid and at least about 10.0 grams per liter of free boric acid, and wherein said pH is less than about 1.0.

16. The bath of claim 14 wherein said lower aliphatic aldehyde is formaldehyde.

17. An aqueous acid plating bath for electrodeposition of tin/lead alloys comprising about 5.0 to 80.0 grams per liter of stannous ion; about 85.0 to 10.0 grams per liter of lead ion; at least about 100.0 grams per liter of a radical selected from the group consisting of fluoborate, fluosilicate and sulfamate; and, as a brigtener system, from about 10.0 to 30.0 grams per liter of a nonionic polyoxyalkylated surfactant selected from the class consisting of ethoxylated fatty acid monoalkanolamines and ethoxylated alkylphenols, at least about 4.0 grams per liter of a lower aliphatic aldedyde containing 1 to 4 carbon atoms, from about 3.0 to 12.0 grams per liter of an aromatic amine selected from the group consisting of ortho- and meta-toluidines, from about 0.4 to 5.0 grams per liter of a brightener selected from the group consisting of heterocyclic carboxaldehydes, aromatic ketones and mixtures thereof, and at least about 0.3 gram per liter of a trichloronated benzene compound, said bath having a pH of less than about 3.0.

18. The bath of claim 17 wherein said trichlorinated benzene compound is 1,2,4-trichlorobenzene.

* * * * *

UNITED STATES PATENT AND TRADEMARK OFFICE
CERTIFICATE OF CORRECTION

PATENT NO. : 4,118,289
DATED : October 3, 1978
INVENTOR(S) : Grace F. Hsu

It is certified that error appears in the above-identified patent and that said Letters Patent are hereby corrected as shown below:

Column 3, line 16, "49.8%" should read -- 49.6% --;

Column 3, line 63, "NEUTRONYX 675" should read -- NEUTRONYX 875 --;

Column 4, line 37, "di-sulfophenyl" should read -- di-p-sulfophenyl --.

Signed and Sealed this

Sixteenth Day of January 1979

[SEAL]

Attest:

RUTH C. MASON
Attesting Officer

DONALD W. BANNER
Commissioner of Patents and Trademarks